United States Patent
Sterrett et al.

(10) Patent No.: US 7,521,115 B2
(45) Date of Patent: *Apr. 21, 2009

(54) LOW TEMPERATURE BUMPING PROCESS

(75) Inventors: Terry Lee Sterrett, Cave Creek, AZ (US); Tian An Chen, Phoenix, AZ (US); Saikumar Jayaraman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/321,060

(22) Filed: Dec. 17, 2002

(65) Prior Publication Data

US 2004/0115408 A1 Jun. 17, 2004

(51) Int. Cl.
*B32B 9/00* (2006.01)

(52) U.S. Cl. .................. 428/323; 428/209; 428/458; 252/512; 252/514

(58) Field of Classification Search ............... 428/323, 428/195, 209, 458; 252/512, 514
See application file for complete search history.

(56) References Cited

U.S. PATENT DOCUMENTS

| | | | | |
|---|---|---|---|---|
| 5,156,771 | A * | 10/1992 | Yamamoto et al. | 252/512 |
| 5,503,777 | A * | 4/1996 | Itagaki et al. | 252/519.21 |
| 5,733,467 | A * | 3/1998 | Kawakita et al. | 216/18 |
| 6,114,413 | A * | 9/2000 | Kang et al. | 523/210 |
| 6,153,938 | A * | 11/2000 | Kanda et al. | 257/778 |
| 6,156,237 | A * | 12/2000 | Kubota et al. | 252/512 |
| 6,237,218 | B1 * | 5/2001 | Ogawa et al. | 29/830 |
| 6,315,927 | B1 * | 11/2001 | Kubota et al. | 252/512 |
| 7,387,827 | B2 * | 6/2008 | Sterrett et al. | 428/131 |

* cited by examiner

*Primary Examiner*—Timothy M Speer
(74) *Attorney, Agent, or Firm*—Marger Johnson & McCollom, P.C.

(57) ABSTRACT

A method for low temperature bumping is disclosed. A resin capable of being cross-linked by free-radical or cationic polymerization at low temperature is provided. Electrically conductive particles are then added to the resin to form a mixture. The mixture is then activated by heat or exposure to light to polymerize the mixture. In an alternative embodiment, a vinyl ether resin is used, to which electrically conductive particles are added. The mixture is polymerized by exposure to light.

5 Claims, 3 Drawing Sheets

LOW TEMPERATURE BUMPING PROCESS

BACKGROUND

The thermal conditions to which most electronic devices are subjected may adversely affect those components made out of alternative materials. For example, polymeric ferroelectric random access memory (PFRAM) devices exposed to temperatures of approximately 140 degrees Celsius (° C.) have significantly decreased performance. For example, a process that exposed a PFRAM to 100° C. for 2 hours followed by a ramp up to 125° C. for 7 minutes caused a thirty percent reduction of cells in the device that retained their contents.

Typically, packaging of electronic components such as microprocessors and other integrated circuits involves high temperatures, especially at the formation of the first level of interconnection. The first level of interconnection is where the integrated circuit is mounted onto the printed circuit board (PCB) so as to allow the integrated circuit to be electrically coupled to the PCB. Some examples of current approaches to the first level of interconnects include wire bonding, which has a typical temperature range of about 140° C. to >200° C., and anisotropic conductive films, which have a typical temperature of 180° C.

BRIEF DESCRIPTION OF THE DRAWINGS

Embodiments of the invention may be best understood by reading the disclosure with reference to the drawings, wherein.

DETAILED DESCRIPTION OF THE EMBODIMENTS

Figure 1:
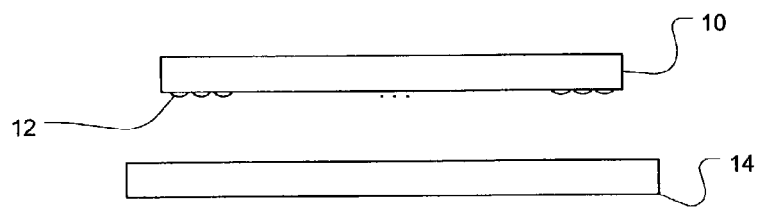
FIG. 1 shows a flip chip integrated circuit arrangement relative to a printed circuit board.

The use of polymeric materials as the first level of interconnect between a flip chip and a printed circuit board would allow processing of the chip at a lower temperature. This would have advantages for integrated circuits, such as polymer ferroelectric random access memories (PFRAM) among others, that suffer performance degradation at the higher temperature normally used. 'Flip chips' are those integrated circuits that are mounted on the printed circuit board operational side down. The first level of interconnection is where the integrated circuit is mounted onto the printed circuit board (PCB) so as to allow the integrated circuit to be electrically coupled to the PCB, typically through conductive bumps patterned onto the integrated circuit die. FIG. 1 shows a block diagram of an integrated circuit die 10 with it associated interconnect bumps 12 just before being mounted to a printed circuit board 14.

Polymeric interconnect bumps manufactured from resin systems could be processed at temperatures from room temperature, approximately 23° C., to 150° C., with the majority of the processing temperatures between 100° C. and 150° C. Polymeric bumps may be stencil printed at pitches from 150 µm to 500 µm. The bump heights may range from about 35 µm to 100 µm. However, selection of the materials used in these bumps must be made carefully, as hydrolytic stability issues may cause conductive filler particles to separate.

Figure 2:
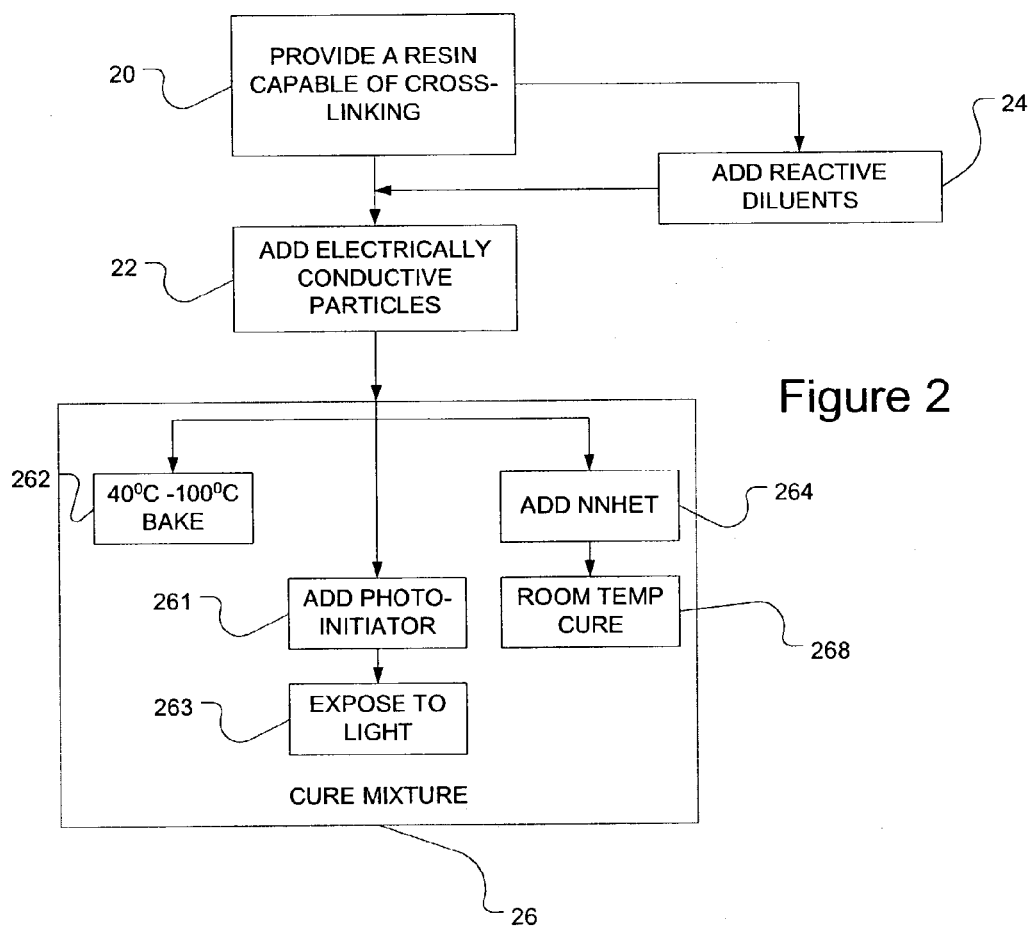
FIG. 2 shows flowchart of a method to produce interconnect bumps.

A flowchart of an embodiment of a method to manufacture polymeric interconnect bumps is shown in FIG. 2. A resin is selected that may be capable of being cross-linked by free-radical polymerization at 20. Suitable resins include olefin materials having double bond structures, such as materials in the following classes: acrylates, methacrylates, epoxies having olefinic groups, and polyimides having olefinic groups. Resins have the structure as shown in FIG. 3 are suitable.

Figure 3:
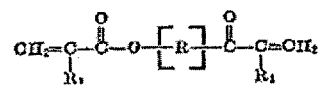
FIG. 3 shows a diagram of a molecular structure for a resin.

In FIG. 3, R1 may be a hydrogen (H) or alkyl of 1 to 4 carbons (C), R is as shown, R2 is a hydrogen or an alkyl group of 1 to 4 carbons, and x can be an integer between 1 to 5. Examples of such resins include, but are not limited to, bis-glycidyl methacrylate (Bis-GMA), ethoxylated bisphenol A (EBPA), etc. As an optional part of the process in FIG. 2, the resin provided in 20 may be blended with reactive diluents at 24 to control viscosity. An example of such diluents includes, but is not limited to, triethylene glycoldimethacrylate (TGMA), etc.

At 22, electrically conductive particles are added. Examples of materials having the electrically conductive properties include, but are not limited to, silver, tin, indium, bismuth, palladium, platinum, nickel, copper and zinc. The particles may be added in spherical or irregularly shaped form, having high hardness and particle size in the range of about 0.1 µm to 100 µm. Concentration of electrically conductive particles may be in the range of about 50 to 200% by weight, particle to resin, and electrically conductive paste (ECP) viscosity may be in the range 1000 to 100000 cPS at room temperature allowing for patterning and formation of a face-centered bump structure via stencil printing or other similar means. ECP viscosity can be adjusted as needed in accordance with processing temperature, noting that applications requiring elevated processing temperatures will be formulated to have relatively high room temperature viscosity because it will tend to decease as temperature is elevated.

A suitable formulation could be a resin blend of 10% bis-GMA, 25% TGMA, 30% EBPA; the mixture having a 35 to 50% resin blend, 0.5 to 1.5% benzoyl peroxide (BPO), 0.01 to 0.05% butylated hydroxoytoluene (BHT), and 65 to 50% conductive filler particle. The mixture would then be polymerized at 26 after being applied to the integrated circuit die. Several different options for polymerization may be available.

Polymerization of the mixture can be initiated by introducing the mixture to 40° C. to 100° C. In this embodiment, the bumps would be applied to the die at 261 and then baked at 262. In order to speed up the reaction 0.01 to 1% N,N-Bis(2-hydroxyethyl)-p-toluidine (NNHET) can be added as an activator at 266. Incorporation of NNHET will allow for cure in the temperature of room temperature (~23° C.) and greater at 268. However, using a material that cures are room temperature will require that the bumps being applied at 267 almost immediately after NNHET is added at 266. Application of the mixture to the die could be done in several ways, such as stencil printing the bumps prior to the curing.

In an alternative embodiment using the electrically conductive polymeric paste material of the resin system and formulation disclosed above, BPO and NNHET are replaced by photo-initiator systems at 263. Suitable photo-initiators include benzyl, camphorquinone, fluorenone, α-napththil. Such photo-initiated systems can be formulated so as to use UV and/or visible light. The mixture would then be exposed to light at 265, after being applied to the integrated circuit die at 264, such as by stencil printing.

Figure 4:
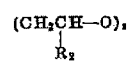
FIG. 4 shows an embodiment of a chemical process to form interconnect bumps.
Figure 4:
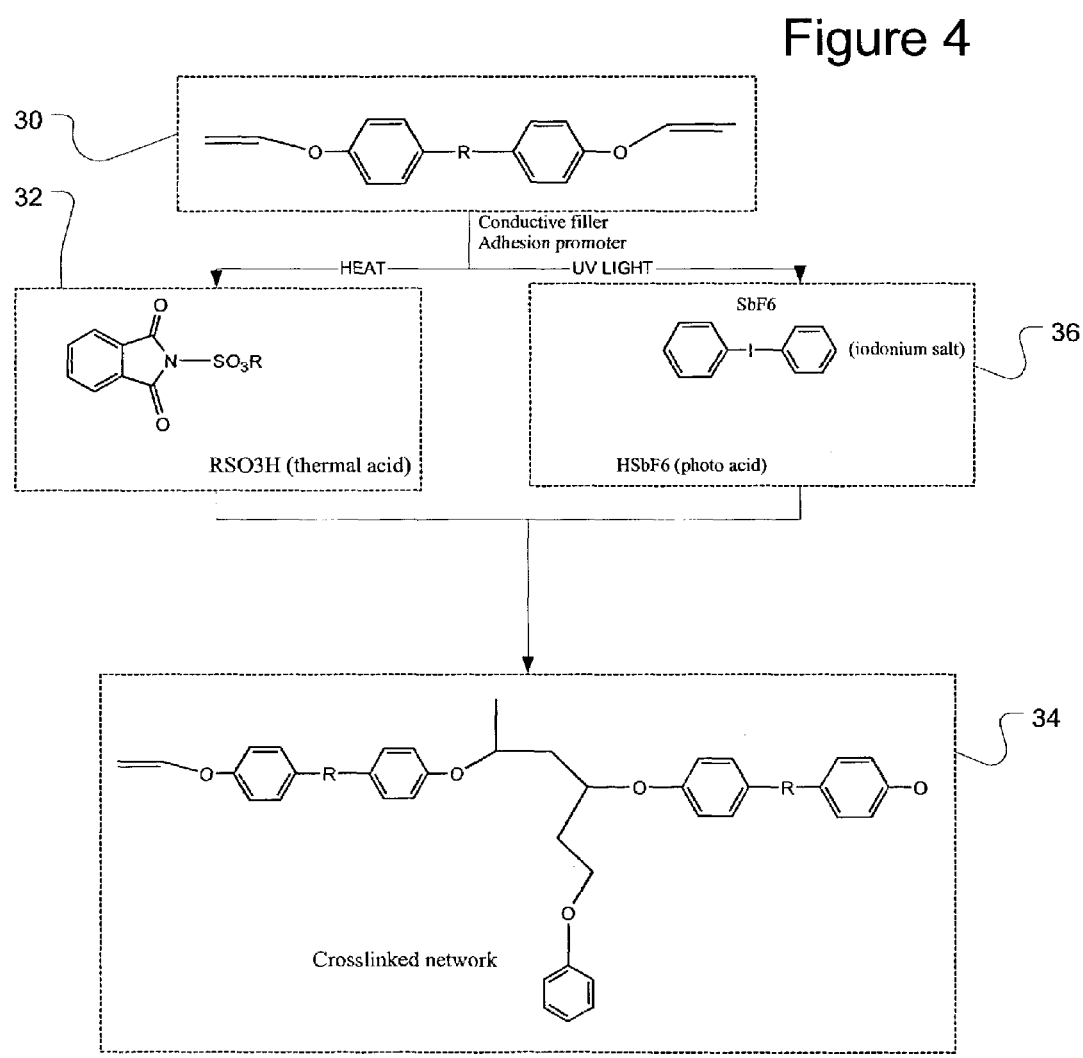

An alternative embodiment of a photopolymerizable system employing cationic polymerization is shown in FIG. 4. Vinyl ether based resins are well known to be cross linked via cations. A vinyl ether system may be as shown in 30, with R having the same definition as set out in FIG. 3. Cations can be generated via thermally degradation of appropriate precursors, or via generation of the same using photo initiated process. Suitable examples of thermally activated acid generators include, but are not limited to, hydroxamic acids esters, diazosulfonates, etc. These degrade at temperatures around but less than 100° C., resulting in acids that catalyze the cross linking of the resin system.

At 30, the vinyl ether resin would be combined with the thermally activated acid generators, the bumps applied at 32 and then the bumps heated at 34. Examples of thermally activated acid generators include hydroxamic acid esters and diazosulfonates. This would result in the structure as shown in 38. A conductive filler adhesion promoter could be added as an optional part of the process prior to applying the bumps.

Proceeding from 30 to 36, light would be used to promote the polymerization. Photo-initiators would be added at 30, the bumps applied at 32 and then exposed to light at 36. Examples of some photo-initiators include iodonium and sulfonium salts, o-nitrobenzyl esters etc. Photo-initiated systems can be formulated so as to use UV and/or visible light.

Other alternatives to acrylates/methacrylate systems that could be crosslinked via free radical mechanism are electron donor/acceptor based systems. One example of such a system may be a maleimides/vinyl ether based system. Here maleimides are the electron acceptors, while the vinyl ethers form the donors. Thus in the presence of photo-initiated radicals, the maleimides react with vinyl ethers thus starting the polymerization, resulting in cross linked network. This can be seen in FIG. 5. The top molecule would be the maleimide molecule that may be then added to the vinyl ether, the middle molecule at 40. The photo-initiator may be then added. Once the bulk mixture is completed, the bumps are applied at 42. The mixture exposed to light after application on the die and this results in the bumps having the structure shown at 44.

A simple formulation would entail, mixing 1:1 maleimide/vinyl ether resin system, to which 1-3 wt % of a photo-initiator, such as BPO, or keto phosphine oxide systems are added. To this conductive filler ranging anywhere from 50 to 90 wt % may be added: The mixture may be stencil printed and exposed to UV light. In the exposed areas, radicals are generated and the material starts to crosslink, thus forming the polymer bumps.

Figure 6:
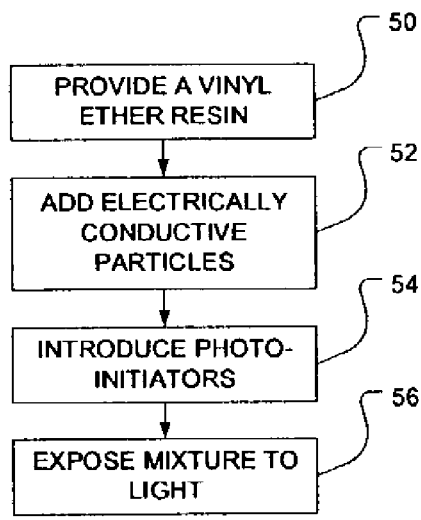
FIG. 6 shows a flowchart of an alternative method to produce interconnect bumps.

In this manner, polymer bumps are formed on an integrated circuit die. A flowchart for an embodiment of a method to manufacture polymer bumps by photo polymerization is shown in FIG. 6. At 50, a vinyl ether resin may be provided.

Figure 5:
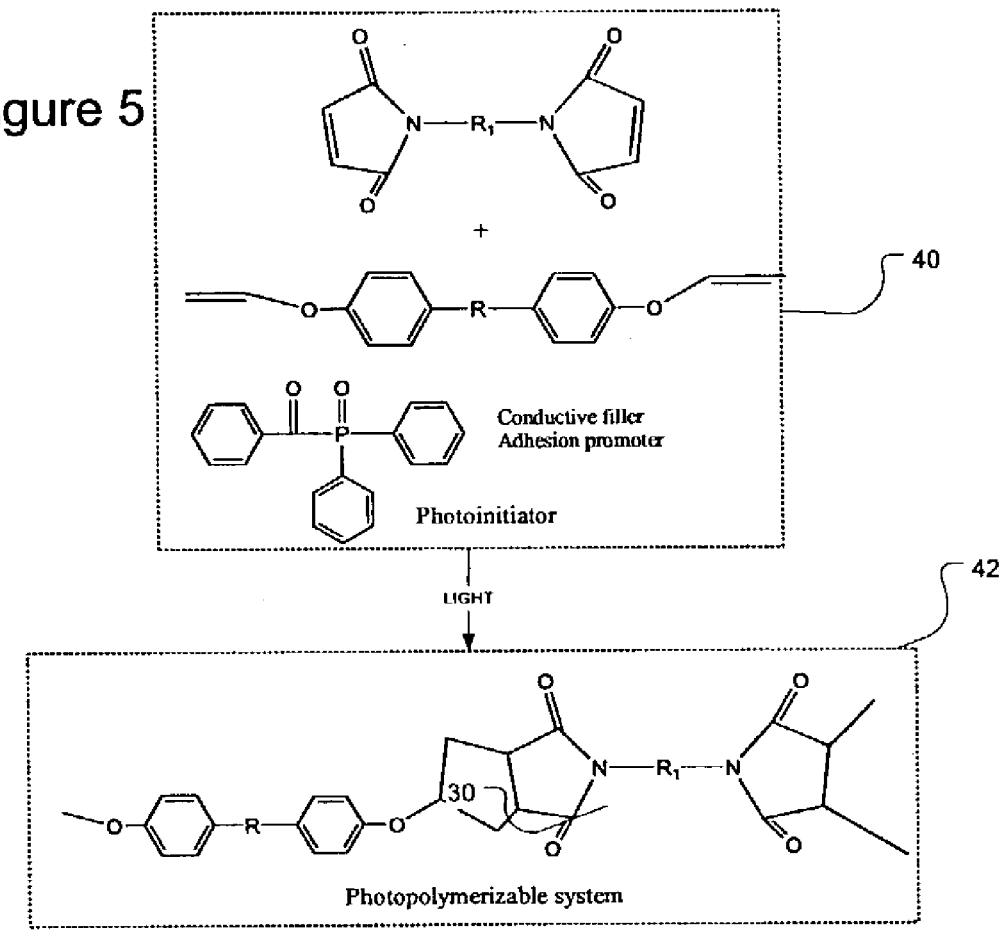
FIG. 5 shows an alternative embodiment of a chemical process to form interconnect bumps.

This may be for the cation cross linking process shown in FIG. 4 or the maleimides system shown in FIG. 5. For the cation cross linking process, thermally activated acid inducers or photo-initiators may be added. For the maleimides system of FIG. 5, both a maleimide and a photo-initiator would be added as part of the process 50.

At 52 the electrically conductive particles are added to the resin mixture. Photo-initiators are then added at 54. The mixture would be applied to the die at 56, such as by stencil printing, and exposed to light at 58. This provides electrically conductive polymer bumps on the die that can be processed at temperatures lower than conventional bumping processes, preventing injury to integrated circuits manufactured out of temperature sensitive materials.

Generally, the embodiments of the invention may result in interconnections having lower residual stress. This is because stress, $\sigma = \Delta\alpha \cdot \Delta T \cdot E$; where $\Delta\alpha$=difference in coefficient of thermal expansion (CTE), $\Delta T$=difference in temperature, E=modulus. In embodiments of the above processes, the polymeric materials resulting have modulus in the range of about 10 to 50 times smaller that metallic counter parts and $\Delta T$ has been substantially decreased. The maximum temperature for curing the material will typically be in a range of about 40° C. to 150° C. The range of stress values for this temperature range is about 0.0034 giga Pascals (GPa, $1 \times 10^9$ Pascals) to 0.02813 GPa, It may be possible that these processes could be adapted to utilize benzocyclobutene (BCB), which has some unique properties that may provide mechanical advantages for flip chip structures. The process may result in electrically conductive BCB. The use of BCB in such a system would form low modulus and therefore high compliance no-lead bumps that provide improved stress distribution and bump fatigue. BCB has a glass transition temperature greater that the expected service temperature thus allowing for essentially linear mechanical behavior through out the device's anticipated service environment. The BCB could be used in any of the embodiments disclosed above and in other variations and modifications of embodiments of the invention.

Thus, although there has been described to this point a particular embodiment for a method and apparatus for a low temperature bumping process, it is not intended that such specific references be considered as limitations upon the scope of this invention except in-so-far as set forth in the following claims.

What is claimed is:

1. An electrically conductive paste, comprising:
   a resin capable of being cross-linked by free-radical polymerization, wherein the resin includes a mixture of bis-glycidyl methacrylate, ethoxylated bisphenol A, and triethlene glycoldimethacrylate (TGMA), and wherein the resin comprises 35 to 50 percent of the paste;
   electrically conductive filler particles dispersed in the resin, wherein the electrically conductive filler particles comprise 50 to 65 percent of the paste and are of a substance selected from the group consisting of: tin, indium, bismuth and zinc, the resulting paste being electrically conductive, wherein each electrically conductive filler particle has an irregularly shaped form and a particle size between 10 μm and 100 μm; and
   wherein the electrically conductive paste is used for forming electrical conductive polymer bumps at low temperature.

2. The paste of claim 1, wherein the resin is a material selected from a group consisting of: acrylates, methacrylates, epoxies having olefinic groups, and polyimides having olefinic groups.

3. A device, comprising:
   a first surface to allow an integrated circuit die to form a connection to the device;
   bumps of electrically conductive paste polymerized by free-radical polymerization, formed on the first surface at temperatures in the range of 23° C to 150° C, wherein the electrically conductive paste is at least partially comprised of meltable, conductive particles having irregularly shaped form, and a resin including a mixture of bis-glycidyl methacrylate, ethoxylated bisphenol A, and triethylene glycoldimethacrylate (TGMA); and an electrical connection formed by the integrated circuit die, the bumps and the device.

4. The device of claim 3, wherein the bumps further comprise bumps of electrically conductive paste cured by application of one of the group consisting of: heat and light.

5. The device of claim 3, wherein interconnections formed from the bumps have a residual stress in the range of about 0.0034 GPa to 0.02813 GPa.

* * * * *

UNITED STATES PATENT AND TRADEMARK OFFICE
CERTIFICATE OF CORRECTION

| | | |
|---|---|---|
| PATENT NO. | : 7,521,115 B2 | Page 1 of 1 |
| APPLICATION NO. | : 10/321060 | |
| DATED | : April 21, 2009 | |
| INVENTOR(S) | : Terry Lee Sterrett et al. | |

It is certified that error appears in the above-identified patent and that said Letters Patent is hereby corrected as shown below:

Column 4, lines 38-39, the word "triethlene" should read -- triethylene --.

Signed and Sealed this

Twenty-seventh Day of October, 2009

David J. Kappos
*Director of the United States Patent and Trademark Office*